(12) United States Patent
Shiraki et al.

(10) Patent No.: US 11,764,729 B2
(45) Date of Patent: Sep. 19, 2023

(54) OSCILLATOR

(71) Applicant: SEIKO EPSON CORPORATION, Tokyo (JP)

(72) Inventors: Manabu Shiraki, Ina (JP); Shinya Aoki, Minowa-machi (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 17/994,702

(22) Filed: Nov. 28, 2022

(65) Prior Publication Data

US 2023/0170846 A1 Jun. 1, 2023

(30) Foreign Application Priority Data

Nov. 30, 2021 (JP) ................. 2021-194025

(51) Int. Cl.
*H03B 5/32* (2006.01)
*H03H 9/10* (2006.01)
*H03H 9/05* (2006.01)

(52) U.S. Cl.
CPC ............ *H03B 5/32* (2013.01); *H03H 9/0552* (2013.01); *H03H 9/1014* (2013.01)

(58) Field of Classification Search
CPC ....... H03B 5/32; H03H 9/0552; H03H 9/1014
See application file for complete search history.

(56) References Cited

U.S. PATENT DOCUMENTS

| 2006/0055479 | A1* | 3/2006 | Okazaki | H03B 5/32 |
| | | | | 331/158 |
| 2010/0060367 | A1 | 3/2010 | Harima et al. | |
| 2013/0057355 | A1* | 3/2013 | Yoshida | H03H 9/1021 |
| | | | | 331/158 |

FOREIGN PATENT DOCUMENTS

WO 2008/136340 A1 11/2008

* cited by examiner

*Primary Examiner* — Jeffrey M Shin
(74) *Attorney, Agent, or Firm* — Rankin, Hill & Clark LLP

(57) ABSTRACT

An oscillator includes: a resonator element; a circuit element configured to output a clock signal; and a container accommodating the resonator element and the circuit element and including a substrate having a first surface. The substrate includes a first electrode provided on the first surface and electrically coupled to the resonator element, a second electrode electrically coupled to the resonator element, and an output electrode configured to output the clock signal. The first electrode and the second electrode are disposed side by side in a first direction. The output electrode is disposed adjacent to the first electrode in a second direction orthogonal to the first direction. When an end portion of the first electrode on a side close to the second electrode is defined as a first end portion, the output electrode includes a first region disposed closer to the second electrode side than the first end portion in the first direction.

7 Claims, 9 Drawing Sheets

OSCILLATOR

The present application is based on, and claims priority from JP Application Serial Number 2021-194025, filed Nov. 30, 2021, the disclosure of which is hereby incorporated by reference herein in its entirety.

BACKGROUND

1. Technical Field

The present disclosure relates to an oscillator.

2. Related Art

In the related art, an oscillator includes a substrate on which an element is mounted, and an integrated circuit element and a piezoelectric element mounted on the substrate. For example, WO2008/136340 discloses a crystal oscillator for surface mounting. The crystal oscillator includes a container having a so-called H-type structure in which first and second recessed portions are respectively provided on two main surfaces, a crystal element is hermetically sealed in the first recessed portion, and an IC chip is accommodated in the second recessed portion. Mounting electrodes corresponding to a pair of crystal terminals of the IC chip provided for coupling with the crystal element are provided on a bottom surface of the second recessed portion. The mounting electrodes have a larger area than other mounting electrodes and are formed as a pair of monitor electrodes used for characteristic inspection of the crystal element.

However, in the crystal oscillator described in WO2008/136340, a contact property is improved by increasing sizes of the mounting electrodes corresponding to the crystal terminals as in the related art, and meanwhile, the following problem occurs. For example, when one of a first crystal electrode and a second crystal electrode, which are two crystal electrodes, and an output electrode are disposed to be adjacent to each other, a first parasitic capacitance between the first crystal electrode and the output electrode is larger than a second parasitic capacitance between the second crystal electrode and the output electrode, and a difference between the first parasitic capacitance and the second parasitic capacitance increases. When the difference between the parasitic capacitances increases, frequency accuracy of an oscillation output signal deteriorates.

SUMMARY

An oscillator includes: a resonator element; a circuit element electrically coupled to the resonator element and configured to output a clock signal; and a container accommodating the resonator element and the circuit element and including a substrate having a first surface on which the circuit element is mounted. The substrate includes a first electrode provided on the first surface and electrically coupled to the resonator element, a second electrode provided on the first surface and electrically coupled to the resonator element, and an output electrode provided on the first surface and configured to output the clock signal. The first electrode and the second electrode are disposed side by side in a first direction. The output electrode is disposed adjacent to the first electrode in a second direction orthogonal to the first direction. When an end portion of the first electrode on a side close to the second electrode is defined as a first end portion, the output electrode includes a first region disposed closer to the second electrode side than the first end portion in the first direction.

DESCRIPTION OF EXEMPLARY EMBODIMENTS

1. First Embodiment

First, an oscillator 1 according to a first embodiment will be described with reference to FIGS. 1 to 5 by taking an oscillator including a tuning fork type resonator element 50 as an example.

Figure 1:
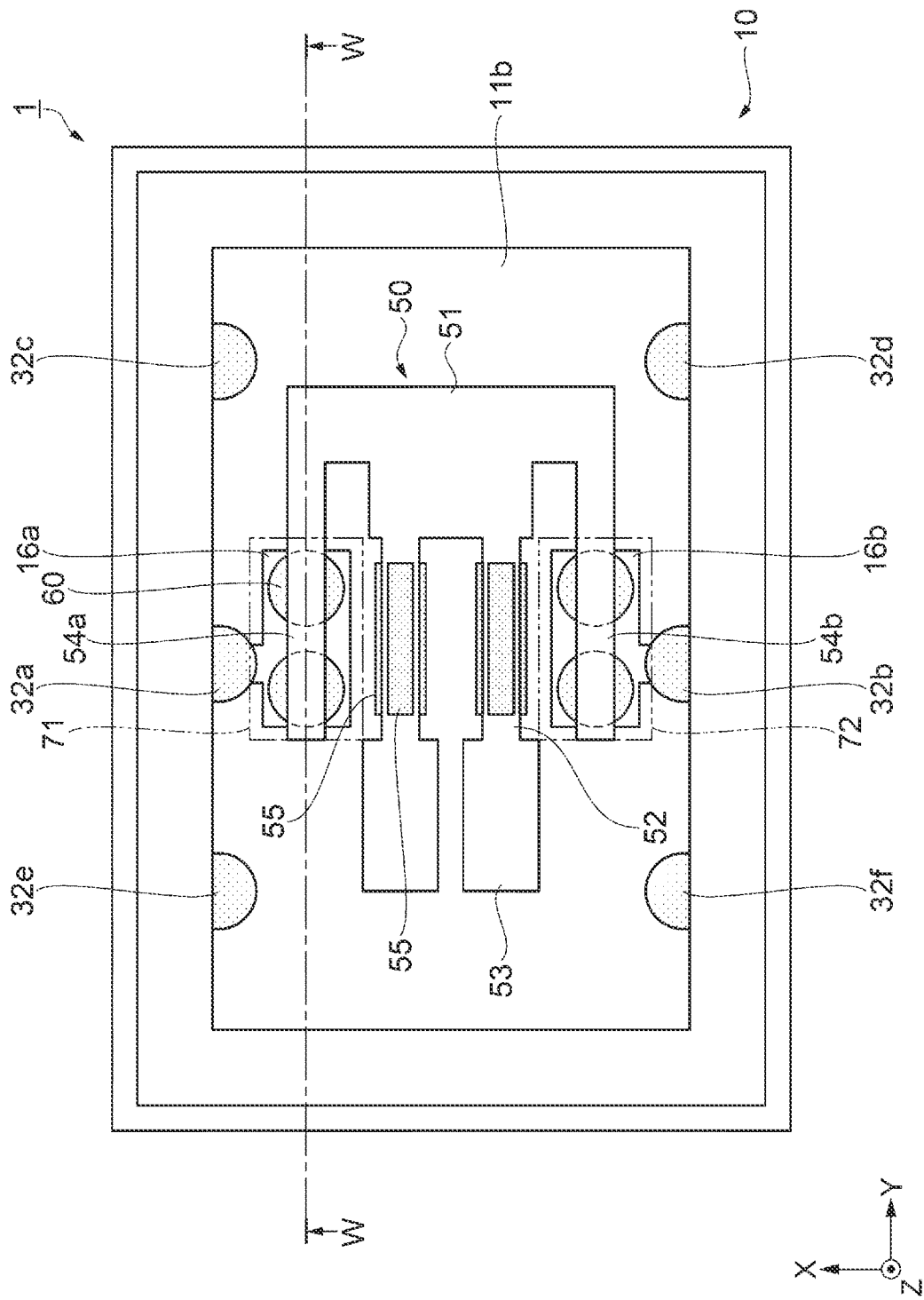
FIG. 1 is a plan view showing a schematic structure of an oscillator according to a first embodiment.
Figure 2:
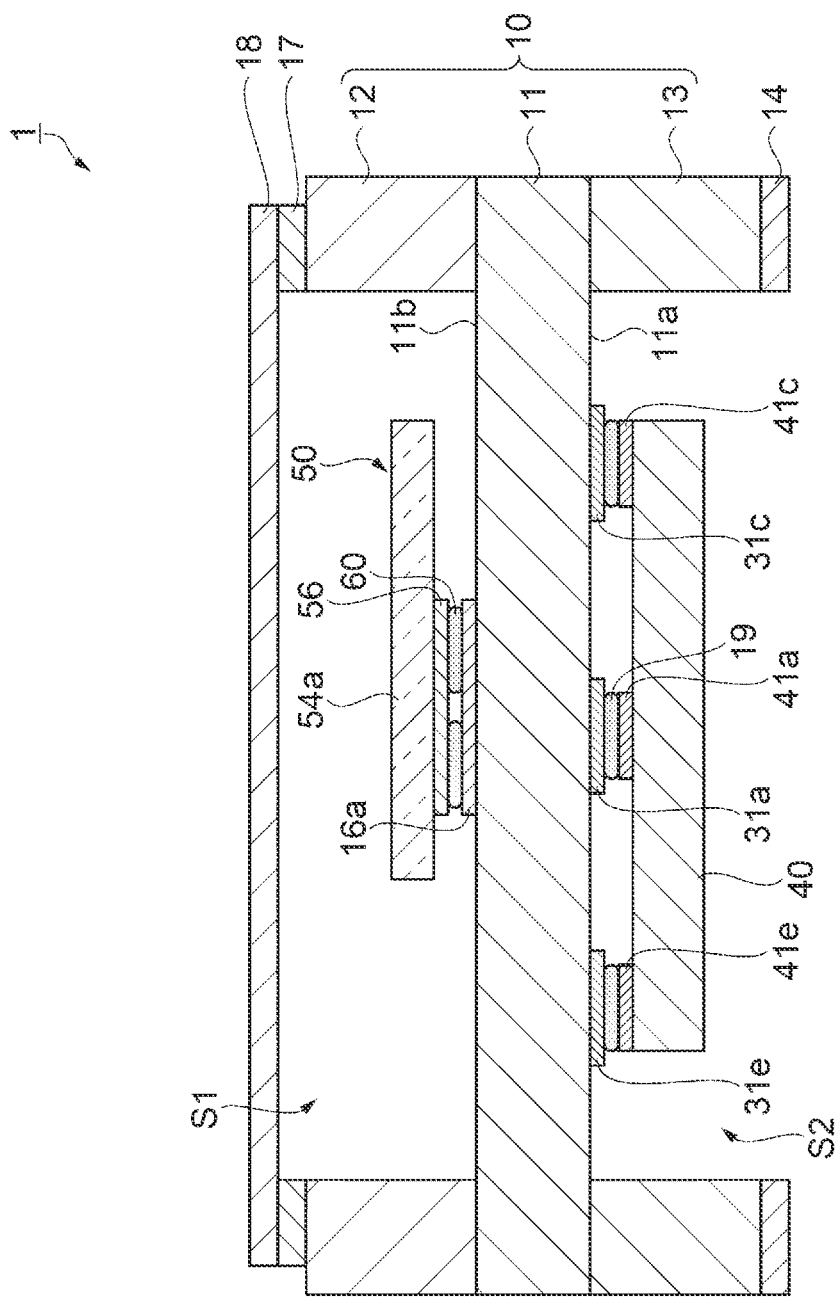
FIG. 2 is a cross-sectional view taken along a W-W line in FIG. 1.

In FIG. 1, for convenience of description of an internal configuration of the oscillator 1, a state in which a lid 18 is removed is shown. In FIG. 2, a wire, which electrically couples mounting terminals 14 provided in a container 10 to electrodes 31c, 31d, 31e, and 31f provided on a first surface 11a of a substrate 11, and a wire, which electrically couples an excitation electrode 55 to a coupling terminal 56, are not shown.

For convenience of description, in the following drawings, an X axis, a Y axis, and a Z axis are shown as three axes orthogonal to one another. A direction along the X axis is referred to as an "X direction", a direction along the Y axis is referred to as a "Y direction", and a direction along the Z axis is referred to as a "Z direction". Further, an arrow tip side in each axial direction is also referred to as a "plus side", a proximal end side is also referred to as a "minus side", a plus side in the Z direction is referred to as "upper", and a minus side in the Z direction is referred to as "lower".

In the present embodiment, a first direction is the X direction, and a second direction orthogonal to the first direction is the Y direction.

As shown in FIGS. 1 and 2, the oscillator 1 according to the present embodiment includes a circuit element 40, the resonator element 50, the container 10 that accommodates the circuit element 40 and the resonator element 50, and the lid 18 that hermetically seals an accommodation space S1 in which the resonator element 50 is accommodated.

The circuit element 40 includes an oscillation circuit that oscillates the resonator element 50, is electrically coupled to the resonator element 50, and outputs a clock signal based on an oscillation frequency of the resonator element 50.

Figure 3:
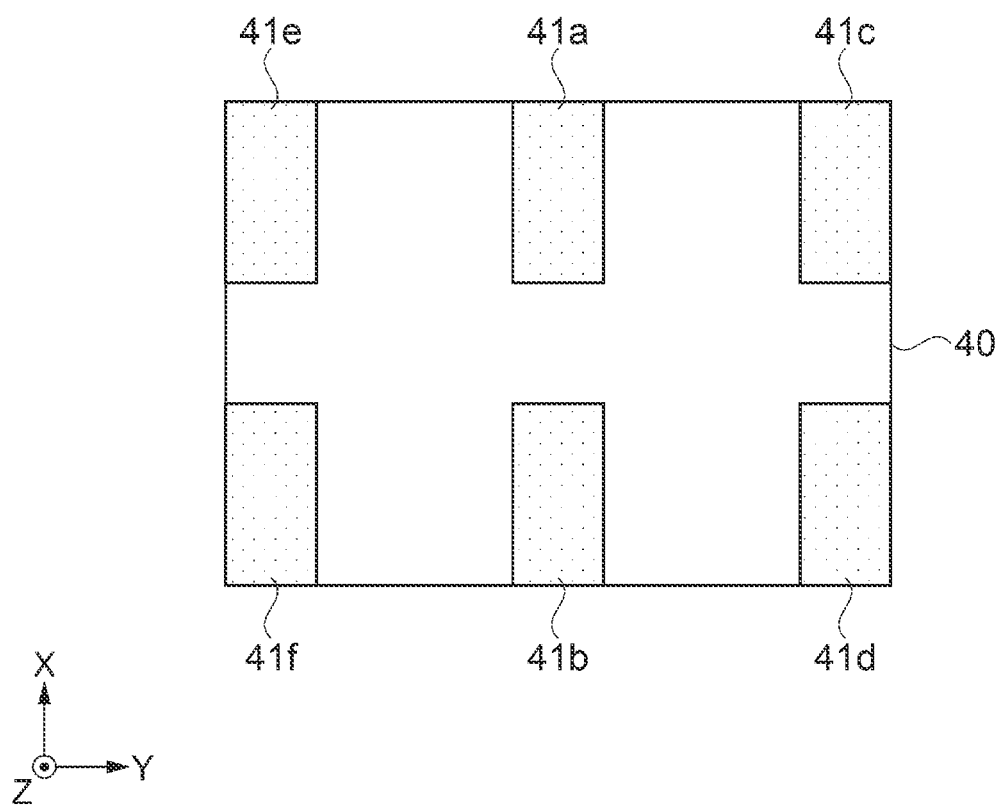
FIG. 3 is a plan view showing a terminal pattern formed on a circuit element.

As shown in FIG. 3, the circuit element 40 includes a first terminal 41*a* coupled to the resonator element 50, a second terminal 41*b* coupled to the resonator element 50 and disposed side by side with the first terminal 41*a* in the X direction, an output terminal 41*c* disposed adjacent to the first terminal 41*a* in the Y direction and configured to output a clock signal, a ground terminal 41*d* disposed adjacent to the second terminal 41*b* in the Y direction, a power supply terminal 41*e* disposed adjacent to the first terminal 41*a* at an opposite side from the output terminal 41*c* side, and a control terminal 41*f* disposed adjacent to the second terminal 41*b* at an opposite side from the ground terminal 41*d* side.

The resonator element 50 is a tuning fork type resonator element having two support arms 54*a* and 54*b*, and oscillates at a resonance frequency caused by an outer shape or an outer dimension and outputs a desired oscillation frequency.

The resonator element 50 uses a piezoelectric material such as quartz crystal as a base material, and includes, as shown in FIG. 1, a base portion 51, two vibrating arms 52 extending from the base portion 51 in a minus Y direction, weight portions 53 coupled to tip end portions of the vibrating arms 52 in the minus Y direction, a first support arm 54*a* and a second support arm 54*b* extending from the base portion 51 in the minus Y direction and provided so as to sandwich the vibrating arms 52, excitation electrodes 55 formed on the vibrating arms 52 and made of gold or the like, and coupling terminals 56 formed on the support arms 54*a* and 54*b* and made of gold or the like. In addition, the resonator element 50 also includes a wire (not shown) that is made of gold or the like and is formed on the vibration arms 52 and the support arms 54*a* and 54*b* so as to electrically couple the excitation electrodes 55 to the coupling terminals 56.

The container 10 is made of ceramics or the like, and is formed by stacking the substrate 11 on which the circuit element 40 and the resonator element 50 having a flat plate shape are mounted, an annular first frame substrate 12 from which a central portion forming the accommodation space S1 for accommodating the resonator element 50 is removed, and an annular second frame substrate 13 which is disposed at an opposite side from the first frame substrate 12 to sandwich the substrate 11 with the first frame substrate 12 and from which a central portion forming an accommodation space S2 for accommodating the circuit element 40 is removed.

The substrate 11 includes the first surface 11*a* on which the circuit element 40 is mounted, and a second surface 11*b* which is in a front-back relationship with the first surface 11*a* and on which the resonator element 50 is mounted.

Figure 4:
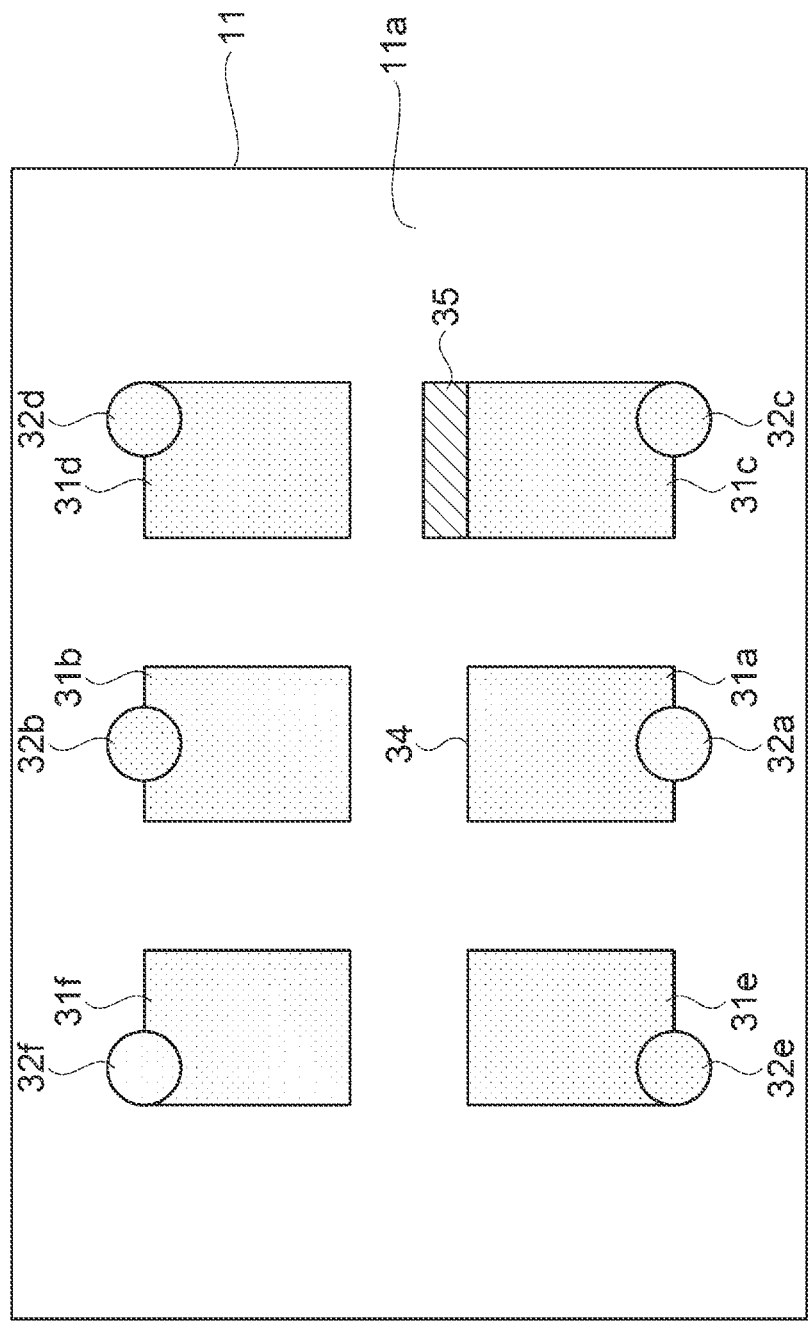
FIG. 4 is a plan view showing an electrode pattern formed on a first surface of a substrate.

As shown in FIG. 4, a first electrode 31*a* electrically coupled to the first terminal 41*a*, a second electrode 31*b* electrically coupled to the second terminal 41*b*, and an output electrode 31*c* electrically coupled to the output terminal 41*c* and configured to output the clock signal are provided on the first surface 11*a* of the substrate 11. In addition, a coupling electrode 31*d* electrically coupled to the ground terminal 41*d*, a power supply electrode 31*e* electrically coupled to the power supply terminal 41*e*, and a control electrode 31*f* electrically coupled to the control terminal 41*f* are provided. The output electrode 31*c*, the coupling electrode 31*d*, the power supply electrode 31*e*, and the control electrode 31*f* are electrically coupled to the mounting terminals 14 provided on a bottom surface of the container 10 by a wire (not shown), respectively.

The first electrode 31*a* and the second electrode 31*b* are disposed side by side in the X direction, which is the first direction, and the output electrode 31*c* is disposed adjacent to the first electrode 31*a* in the Y direction, which is the second direction. When an end portion of the first electrode 31*a* on a side close to the second electrode 31*b* is defined as a first end portion 34, the output electrode 31*c* includes a first region 35 indicated by diagonal lines and disposed closer to the second electrode 31*b* side than the first end portion 34 in the X direction.

Therefore, an interval between the output electrode 31*c* and the second electrode 31*b* can be reduced, and a parasitic capacitance between the output electrode 31*c* and the second electrode 31*b* can be increased as compared with a case in which the first region 35 is not provided. Therefore, a difference between a parasitic capacitance between the first electrode 31*a* and the output electrode 31*c* and the parasitic capacitance between the second electrode 31*b* and the output electrode 31*c* can be reduced.

The substrate 11 is provided with through electrodes 32*a*, 32*b*, 32*c*, 32*d*, 32*e*, and 32*f* penetrating the first surface 11*a* and the second surface 11*b*. The through electrodes 32*a*, 32*b*, 32*c*, 32*d*, 32*e*, and 32*f* are electrically coupled to the electrodes 31*a*, 31*b*, 31*c*, 31*d*, 31*e*, and 31*f* on the first surface 11*a*, respectively.

The circuit element 40 is mounted on the first surface 11*a* of the substrate 11. As shown in FIG. 2, the electrodes 31*a*, 31*b*, 31*c*, 31*d*, 31*e*, and 31*f* on the first surface 11*a* and the terminals 41*a*, 41*b*, 41*c*, 41*d*, 41*e*, and 41*f* provided on the circuit element 40 are electrically and mechanically coupled to each other through a conductive adhesive or bonding members 19 such as a gold bump.

Figure 5:
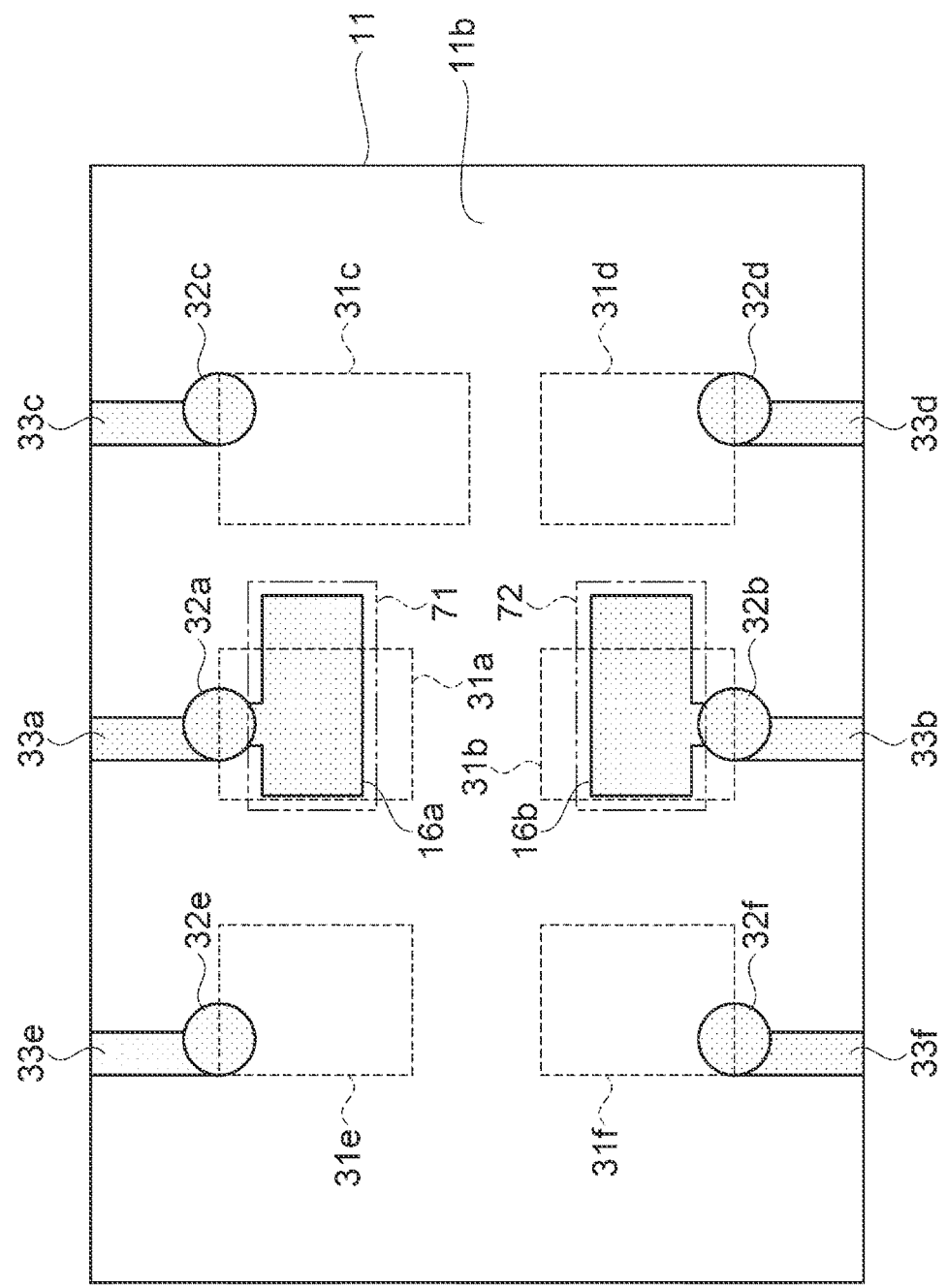
FIG. 5 is a plan view showing a wire and an electrode pattern that are formed on a second surface of the substrate.

As shown in FIG. 5, the second surface 11*b* of the substrate 11 is provided with a first wire 33*a* electrically coupled to the first electrode 31*a* through the through electrode 32*a*, a second wire 33*b* electrically coupled to the second electrode 31*b* through the through electrode 32*b*, and an output wire 33*c* electrically coupled to the output electrode 31*c* through the through electrode 32*c*. In addition, a ground wire 33*d* electrically coupled to the coupling electrode 31*d* through the through electrode 32*d*, a power supply wire 33*e* electrically coupled to the power supply electrode 31*e* through the through electrode 32*e*, and a control wire 33*f* electrically coupled to the control electrode 31*f* through the through electrode 32*f* are provided.

The second surface 11*b* of the substrate 11 is provided with a first mount electrode 16*a* electrically coupled to the through electrode 32*a* at a first position 71 overlapping the first electrode 31*a* provided on the first surface 11*a* in a plan view, and a second mount electrode 16*b* electrically coupled to the through electrode 32*b* at a second position 72 overlapping the second electrode 31*b* provided on the first surface 11*a* in a plan view.

The resonator element 50 is mounted on the second surface 11*b* of the substrate 11, the first support arm 54*a* of the resonator element 50 is bonded to the first mount electrode 16*a* at the first position 71, and the second support arm 54*b* of the resonator element 50 is bonded to the second mount electrode 16*b* at the second position 72. More specifically, as shown in FIG. 2, the mount electrodes 16*a* and 16*b* on the second surface 11*b* and the coupling terminals 56 provided on the support arms 54*a* and 54*b* of the resonator element 50 are electrically and mechanically coupled to each other through bonding members 60 such as a gold bump.

The lid 18 is made of metal, ceramics, glass, or the like, and is bonded to the container 10 through bonding members 17 such as a seal ring or low melting point glass, so that the accommodation space S1 in which the resonator element 50 is accommodated and hermetically sealed can be formed. The accommodation space S1 is an airtight space, and is in a depressurized state, preferably in a state closer to a vacuum.

In the present embodiment, the tuning fork type resonator element including the support arms 54a and 54b is described as an example of the resonator element 50. The present disclosure is not limited thereto, and a tuning fork type resonator element or a thickness-shear resonator element without the support arms 54a and 54b may be used.

In the oscillator 1 according to the present embodiment, since the output electrode 31c provided on the first surface 11a of the substrate 11 includes the first region 35 disposed closer to the second electrode 31b side than the first end portion 34 of the first electrode 31a, the interval between the output electrode 31c and the second electrode 31b can be reduced, and the parasitic capacitance between the output electrode 31c and the second electrode 31b can be increased as compared with the case in which the first region 35 is not provided. Therefore, the difference between the parasitic capacitance between the first electrode 31a and the output electrode 31c and the parasitic capacitance between the second electrode 31b and the output electrode 31c can be reduced, and a highly accurate oscillation output signal can be output.

2. Second Embodiment

Next, an oscillator 1a according to a second embodiment will be described with reference to FIG. 6.

The oscillator 1a according to the present embodiment is the same as the oscillator 1 according to the first embodiment except that a shape of an output electrode 31ca provided on a first surface 11a of a substrate 110a is different from that of the oscillator 1 according to the first embodiment. Differences from the first embodiment described above will be mainly described, and a description of the same matters will be omitted.

Figure 6:
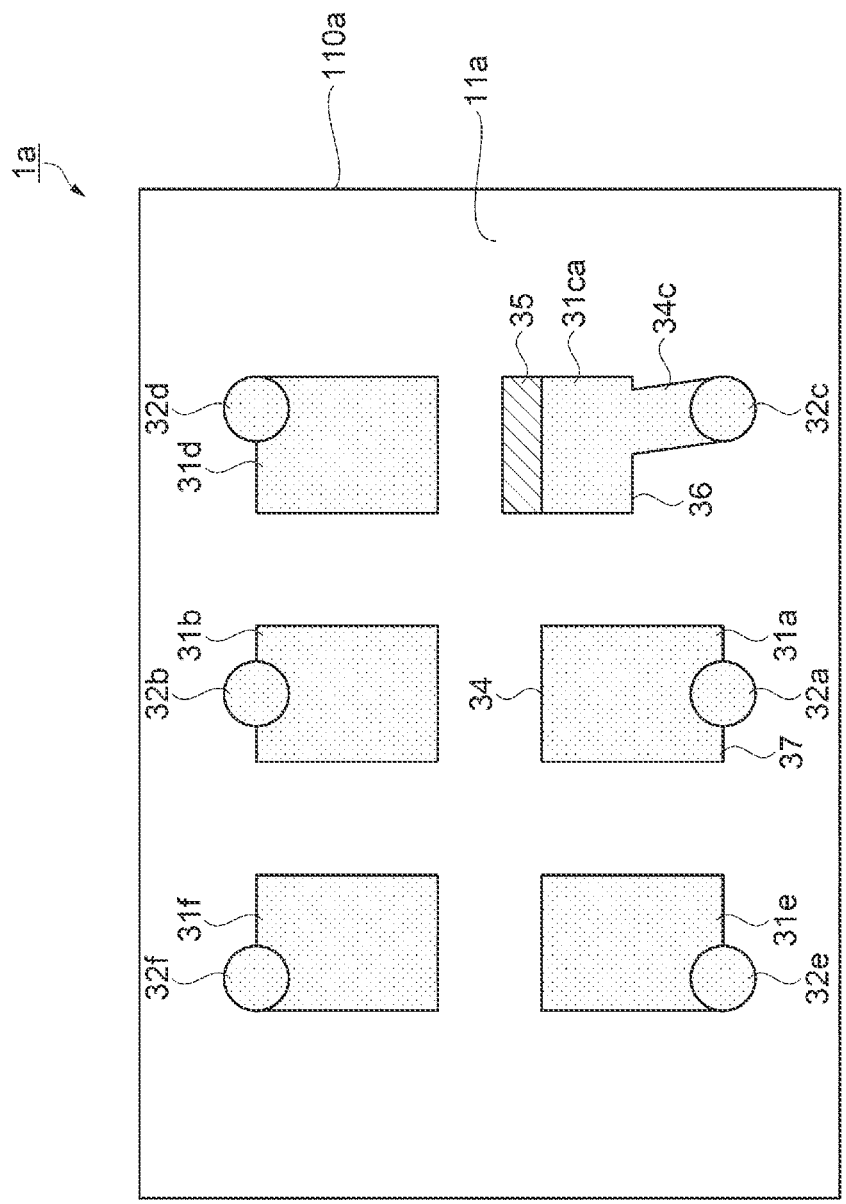
FIG. 6 is a plan view showing an electrode pattern formed on a first surface of a substrate included in an oscillator according to a second embodiment.

In the oscillator 1a, as shown in FIG. 6, the output electrode 31ca provided on the first surface 11a of the substrate 110a is electrically coupled to the through electrode 32c through a lead wire 34c extending from the through electrode 32c. When an end portion of the output electrode 31ca at an opposite side from the first region 35 is referred to as a second end portion 36 and an end portion of the first electrode 31a at an opposite side from the first end portion 34 is referred to as a third end portion 37, the second end portion 36 is located closer to the first region 35 side than the third end portion 37 in the X direction. That is, a length of the output electrode 31ca in the X direction is shorter than that of the output electrode 31c of the first embodiment. An area of the output electrode 31ca is smaller than areas of the first electrode 31a and the second electrode 31b.

Therefore, a region of the output electrode 31ca close to the first electrode 31a can be reduced, and a parasitic capacitance between the first electrode 31a and the output electrode 31ca can be reduced. Therefore, a difference between the parasitic capacitance between the first electrode 31a and the output electrode 31ca and a parasitic capacitance between the second electrode 31b and the output electrode 31ca can be reduced.

With such a configuration, it is possible to obtain the same effect as that of the oscillator 1 according to the first embodiment.

3. Third Embodiment

Next, an oscillator 1b according to a third embodiment will be described with reference to FIG. 7.

The oscillator 1b according to the present embodiment is the same as the oscillator 1 according to the first embodiment except that a shape of a second electrode 31bb provided on a first surface 11a of a substrate 110b is different from that of the oscillator 1 according to the first embodiment. Differences from the first embodiment described above will be mainly described, and a description of the same matters will be omitted.

Figure 7:
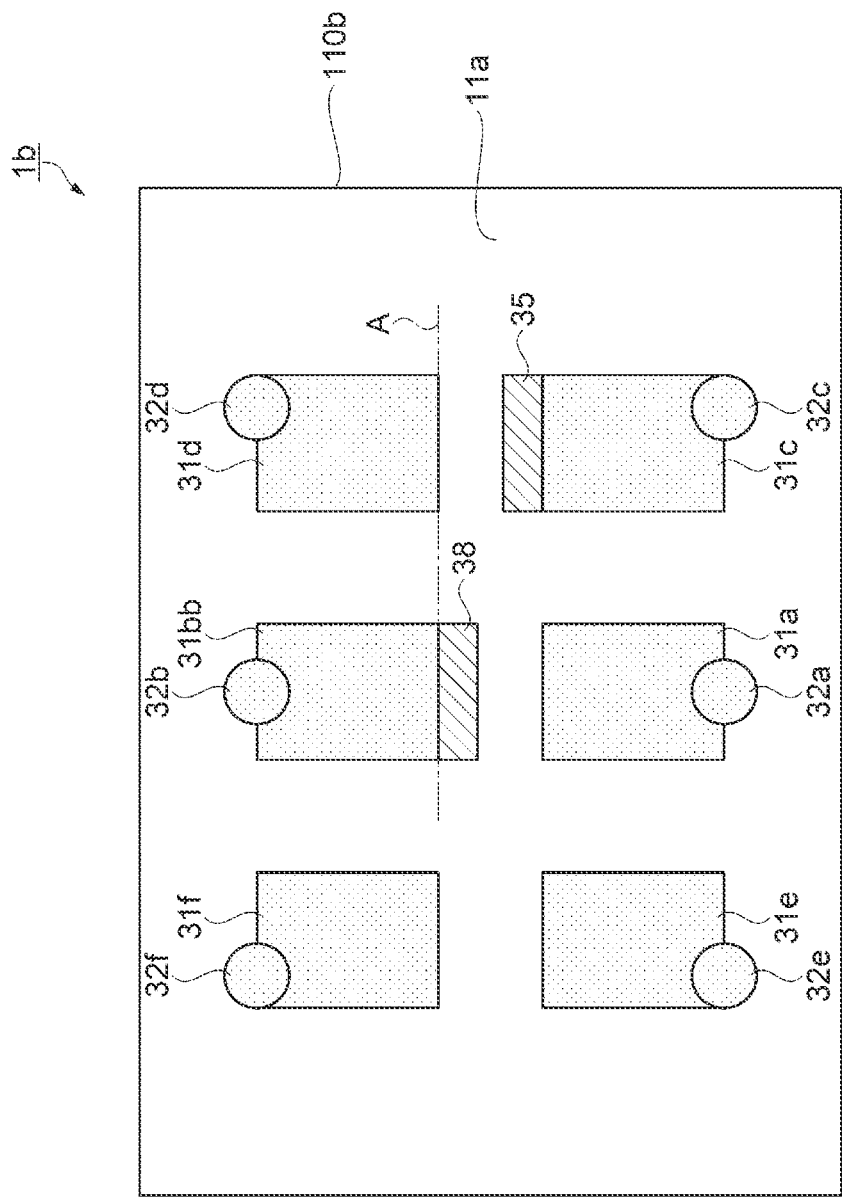
FIG. 7 is a plan view showing an electrode pattern formed on a first surface of a substrate included in an oscillator according to a third embodiment.

In the oscillator 1b, as shown in FIG. 7, in the second electrode 31bb provided on the first surface 11a of the substrate 110b, when a virtual line that passes through an end portion on the output electrode 31c side of the coupling electrode 31d disposed adjacent to the second electrode 31bb in the Y direction and extends along the Y direction is defined as a virtual line A, the second electrode 31bb includes a second region 38 indicated by diagonal lines and disposed closer to the first electrode 31a side than the virtual line A. That is, a length of the second electrode 31bb in the X direction is longer than that of the second electrode 31b of the first embodiment.

Therefore, an interval between the second electrode 31bb and the output electrode 31c can be reduced, and a parasitic capacitance between the second electrode 31bb and the output electrode 31c can be increased as compared with a case in which the second region 38 is not provided. Therefore, a difference between a parasitic capacitance between the first electrode 31a and the output electrode 31c and the parasitic capacitance between the second electrode 31bb and the output electrode 31c can be reduced.

With such a configuration, it is possible to obtain the same effect as that of the oscillator 1 according to the first embodiment.

4. Fourth Embodiment

Next, an oscillator 1c according to a fourth embodiment will be described with reference to FIG. 8.

The oscillator 1c according to the present embodiment is the same as the oscillator 1 according to the first embodiment except that a shape of an output electrode 31cc provided on a first surface 11a of a substrate 110c is different from that of the oscillator 1 according to the first embodiment. Differences from the first embodiment described above will be mainly described, and a description of the same matters will be omitted.

Figure 8:
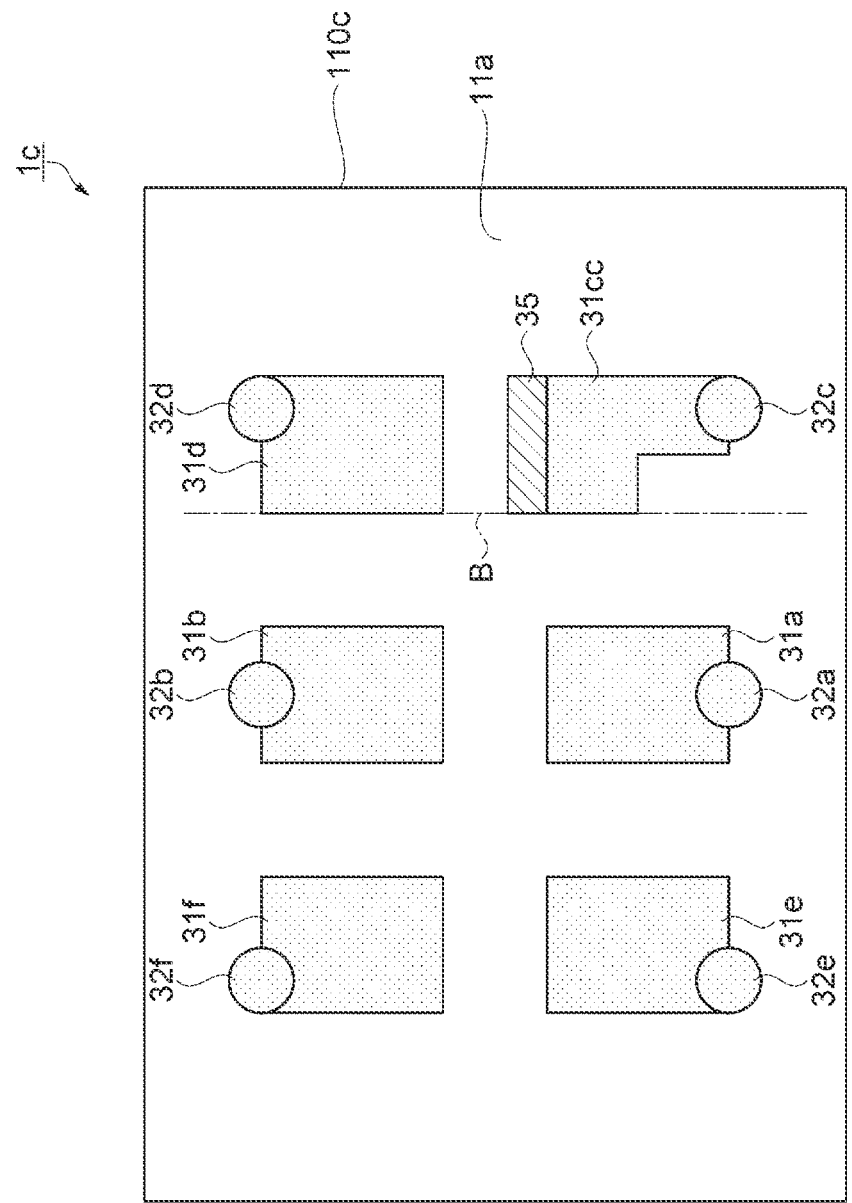
FIG. 8 is a plan view showing an electrode pattern formed on a first surface of a substrate included in an oscillator according to a fourth embodiment.

In the oscillator 1c, as shown in FIG. 8, in the output electrode 31cc provided on the first surface 11a of the substrate 110c, when a virtual line that passes through an end portion of the coupling electrode 31d on the second electrode 31b side and extends along the X direction is defined as a virtual line B, at least a part of an end portion of the output electrode 31cc on the first electrode 31a side is separated from the virtual line B to a side opposite from the first electrode 31a side in the Y direction. That is, a part of the output electrode 31cc on the first electrode 31a side is recessed to the side opposite from the first electrode 31a side.

Therefore, a region of the output electrode 31cc close to the first electrode 31a can be reduced, and a parasitic capacitance between the first electrode 31a and the output electrode 31cc can be reduced. Therefore, a difference between the parasitic capacitance between the first electrode 31a and the output electrode 31cc and a parasitic capacitance between the second electrode 31b and the output electrode 31cc can be reduced.

With such a configuration, it is possible to obtain the same effect as that of the oscillator 1 according to the first embodiment.

5. Fifth Embodiment

Next, an oscillator 1d according to a fifth embodiment will be described with reference to FIG. 9.

The oscillator 1d according to the present embodiment is the same as the oscillator 1 according to the first embodiment except that a shape of an output electrode 31cd provided on a first surface 11a of a substrate 110d is different from that of the oscillator 1 according to the first embodiment. Differences from the first embodiment described above will be mainly described, and a description of the same matters will be omitted.

Figure 9:
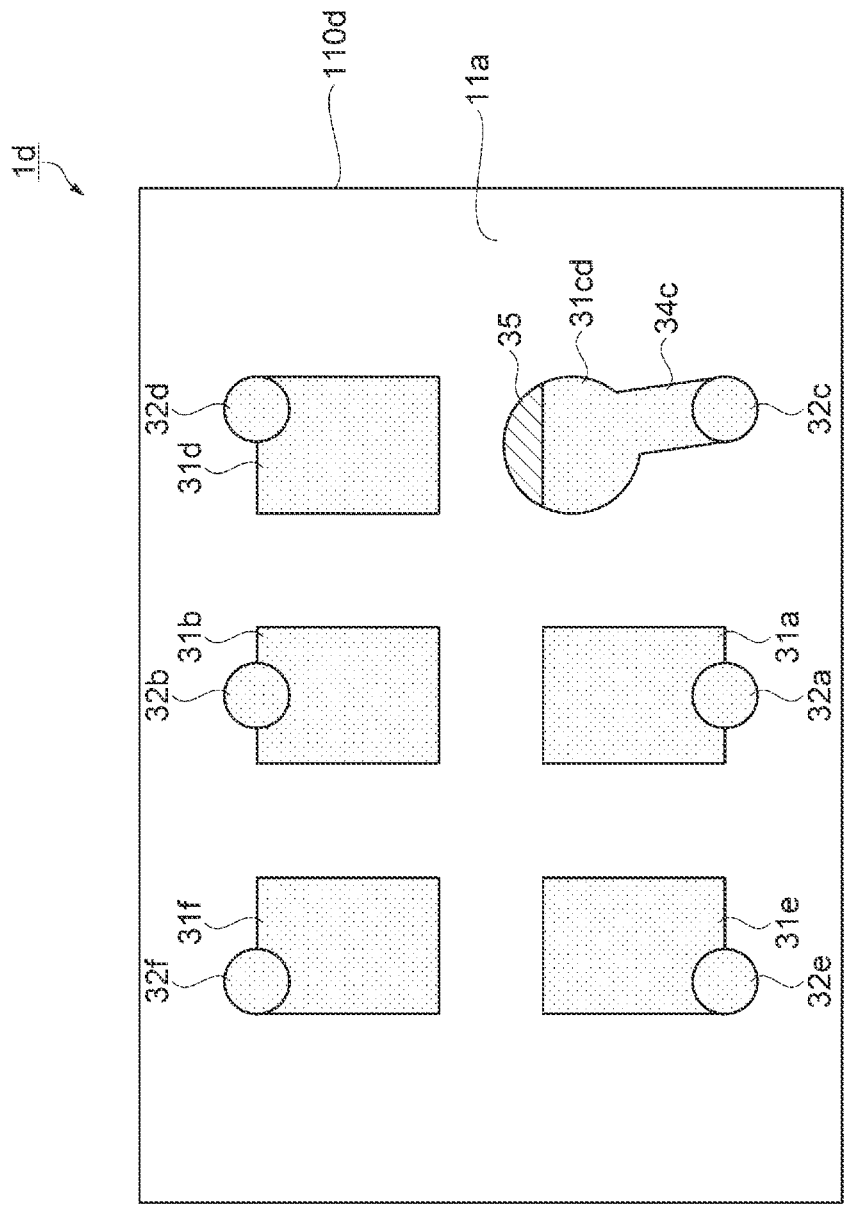
FIG. 9 is a plan view showing an electrode pattern formed on a first surface of a substrate included in an oscillator according to a fifth embodiment.

As shown in FIG. 9, in the oscillator 1d, the output electrode 31cd provided on the first surface 11a of the substrate 110d is electrically coupled to the through electrode 32c through the lead wire 34c extending from the through electrode 32c. The output electrode 31cd has a circular shape in a plan view, and an area of the output electrode 31cd is smaller than areas of the first electrode 31a and the second electrode 31b.

Therefore, a region of the output electrode 31cd close to the first electrode 31a can be further reduced, and a parasitic capacitance between the first electrode 31a and the output electrode 31cd can be further reduced. Therefore, a difference between the parasitic capacitance between the first electrode 31a and the output electrode 31cd and a parasitic capacitance between the second electrode 31b and the output electrode 31cd can be reduced.

In the present embodiment, the output electrode 31cd has a circular shape in a plan view, but the present disclosure is not limited thereto, and the output electrode 31cd may have an elliptical shape or an oval shape in a plan view.

With such a configuration, it is possible to obtain the same effect as that of the oscillator 1 according to the first embodiment.

What is claimed is:

1. An oscillator comprising:
 a resonator element;
 a circuit element electrically coupled to the resonator element and configured to output a clock signal; and
 a container accommodating the resonator element and the circuit element and includes a substrate including a first surface on which the circuit element is mounted, wherein
 the substrate includes:
  a first electrode provided on the first surface and electrically coupled to the resonator element;
  a second electrode provided on the first surface and electrically coupled to the resonator element; and
  an output electrode provided on the first surface and configured to output the clock signal,
 the first electrode and the second electrode are disposed side by side in a first direction,
 the output electrode is disposed adjacent to the first electrode in a second direction orthogonal to the first direction, and
 when an end portion of the first electrode on a side close to the second electrode is defined as a first end portion, the output electrode includes a first region disposed closer to the second electrode side than the first end portion in the first direction.

2. The oscillator according to claim 1, wherein
when an end portion of the output electrode at an opposite side from the first region is referred to as a second end portion and an end portion of the first electrode at an opposite side from the first end portion is referred to as a third end portion, the second end portion is located closer to the first region side than the third end portion in the first direction.

3. The oscillator according to claim 1, wherein
the substrate further includes a coupling electrode provided on the first surface and disposed adjacent to the second electrode in the second direction, and
when a virtual line that passes through an end portion of the coupling electrode on the output electrode side and extends along the second direction is defined as a virtual line A, the second electrode includes a second region disposed closer to the first electrode side than the virtual line A.

4. The oscillator according to claim 3, wherein
when a virtual line that passes through an end portion of the coupling electrode on the second electrode side and extends along the first direction is defined as a virtual line B, at least a part of an end portion of the output electrode on the first electrode side is separated from the virtual line B to a side opposite from the first electrode side in the second direction.

5. The oscillator according to claim 1, wherein
an area of the output electrode is smaller than areas of the first electrode and the second electrode.

6. The oscillator according to claim 5, wherein
the output electrode has any one of a circular shape, an elliptical shape, and an oval shape in a plan view.

7. The oscillator according to claim 1, wherein
the resonator element includes two vibrating arms, and a first support arm and a second support arm provided so as to sandwich the vibrating arms in a plan view,
the first support arm is bonded to a second surface of the substrate at a first position, the second surface being in a front-back relationship with the first surface,
the second support arm is bonded to the second surface at a second position,
the first position overlaps the first electrode in a plan view, and
the second position overlaps the second electrode in the plan view.

* * * * *